(12) United States Patent
Broughton (10) Patent No.: US 8,022,734 B1
(45) Date of Patent: Sep. 20, 2011

(54) LOW CURRENT POWER DETECTION CIRCUIT PROVIDING WINDOW COMPARATOR FUNCTIONALITY

(75) Inventor: Robert Broughton, Chester, NH (US)

(73) Assignee: Peregrine Semiconductor Corporation, San Diego, CA (US)

( * ) Notice: Subject to any disclaimer, the term of this patent is extended or adjusted under 35 U.S.C. 154(b) by 59 days.

(21) Appl. No.: 12/197,636

(22) Filed: Aug. 25, 2008

(51) Int. Cl.
  *H03K 5/22* (2006.01)
(52) U.S. Cl. ............... 327/65; 327/58; 327/59; 327/60; 327/61; 327/62; 455/115.3
(58) Field of Classification Search ............ 327/62, 327/65; 455/15.31, 115.3
See application file for complete search history.

(56) References Cited

U.S. PATENT DOCUMENTS

| | | | |
|---|---|---|---|
| 5,564,086 A | 10/1996 | Cygan et al. | |
| 6,108,527 A | 8/2000 | Urban et al. | |
| 6,239,658 B1 | 5/2001 | Tham | |
| 6,265,939 B1 | 7/2001 | Wan et al. | |
| 6,472,860 B1 | 10/2002 | Tran et al. | |
| 6,504,403 B2 * | 1/2003 | Bangs et al. | 327/62 |
| 6,727,754 B2 | 4/2004 | Dupuis et al. | |
| 6,731,915 B1 | 5/2004 | Tran et al. | |
| 6,756,849 B2 | 6/2004 | Dupuis et al. | |
| 6,927,630 B2 | 8/2005 | Dupuis et al. | |
| 7,010,284 B2 | 3/2006 | Liu et al. | |
| 7,038,609 B1 | 5/2006 | Hurrell | |
| 7,042,285 B2 | 5/2006 | Parkhurst et al. | |
| 7,071,776 B2 | 7/2006 | Forrester et al. | |
| 7,113,754 B2 | 9/2006 | Chien | |
| 7,116,948 B2 * | 10/2006 | Chien | 455/115.3 |
| 7,260,367 B2 | 8/2007 | McMorrow et al. | |
| 7,348,853 B2 | 3/2008 | Camnitz et al. | |
| 7,353,006 B2 | 4/2008 | Gels et al. | |
| 2005/0059362 A1 | 3/2005 | Kalajo et al. | |
| 2007/0182490 A1 | 8/2007 | Hau et al. | |
| 2007/0287393 A1 | 12/2007 | Nandipaku et al. | |

OTHER PUBLICATIONS

Hu, Stacy, "A 450MHz CMOS RF Power Detector", IEEE Radio Frequency Integrated Circuits Symposium, 2001, pp. 209-212, US.

* cited by examiner

*Primary Examiner* — Lincoln Donovan
*Assistant Examiner* — John Poos
(74) *Attorney, Agent, or Firm* — Gesmer Updegrove LLP (57) ABSTRACT

A power detection system is disclosed that includes a detector circuit and a comparator circuit. The detector circuit includes a first transistor, a second transistor that is not identical to the first transistor, and a third transistor that is substantially identical to the first transistor. Each of the transistors is commonly coupled to a current source and is coupled to a differential input voltage. The comparator circuit is for providing an output that is representative of whether the input voltage is above or below a threshold voltage responsive to a difference between the first transistor and the second transistor.

20 Claims, 8 Drawing Sheets

LOW CURRENT POWER DETECTION CIRCUIT PROVIDING WINDOW COMPARATOR FUNCTIONALITY

BACKGROUND

The present invention generally relates to power detectors for use in wireless communication systems, and relates in particular to systems and methods for reducing power requirements of a wireless communication system.

Wireless communication systems generally include transmitter and receiver circuits that have power (e.g., current) requirements that vary during use, due at least in part, to usage, network characteristics, and antenna characteristics. For example, the power required for signal transmission through an antenna may vary, and it is generally important to monitor the output power of the antenna during use. Failure to monitor this output power may result in too little power being employed, which may lead to dropped calls, or may result in too much power being used, which may lead to decreased useful battery life and/or network jamming.

For example, U.S. Pat. No. 6,265,939 discloses a power detector that employs a rectifying diode circuit that senses a peak RF signal coupled thereto, and the circuit provides a linear power detection functionality.

U.S. Pat. No. 7,353,006 discloses systems and methods for detecting output power in a transmission system that includes a power amplifier, a track and hold circuit, a log power detector in a feedback path, and a log power detector in a reference path in communication with the track and hold circuit. Such systems provide a wider range of detection of a logarithmic scale, but operate continuously and consume an amount of current that is not insubstantial, at least in part, due to the fact that such systems employ the use of logarithmic amplifiers in the power detection circuits.

Battery power requirements of wireless transmission systems that employ power amplifiers typically require that current use be minimized. U.S. Pat. No. 6,756,849 discloses power detector systems for CMOS devices that employ a first envelope detector that is coupled to a voltage sensor, and a second envelope detector that is coupled to a current sensor. Although the system is disclosed to be suitable for use with CMOS systems that employ dual gate oxide devices for using two power levels, the envelope detectors are disclosed to be logarithmic amplifiers in an example, and the system operates continuously.

There is a need, therefore, for a system and method for providing power detection with reduced current requirements.

SUMMARY

The invention provides a power detection system that includes a detector circuit and a comparator circuit in accordance with an embodiment. The detector circuit includes a first transistor, a second transistor that is not identical to the first transistor, and a third transistor that is substantially identical to the first transistor. Each of the transistors is commonly coupled to a current source and is coupled to a differential input voltage. The comparator circuit is for providing an output that is representative of whether the input voltage is above or below a threshold voltage responsive to a difference between the first transistor and the second transistor.

In accordance with another embodiment, the power detection system includes a first detector circuit, a second detector circuit, and a comparator circuit. The first detector circuit includes a first transistor, a second transistor that is not identical to the first transistor, and a third transistor that is substantially identical to the first transistor. Each of the first, second and third transistors is commonly coupled to a first current source and is coupled to a first differential input voltage. The second detector circuit includes a fourth transistor, a fifth transistor that is not identical to the fourth transistor, and a sixth transistor that is substantially identical to the fourth transistor. Each of the fourth, fifth and sixth transistors is commonly coupled to a second current source and is coupled to a second differential input voltage. The comparator circuit is for providing an output that is representative of whether the first input voltage is above or below a first threshold voltage responsive to a difference between the first and second transistors, and that is representative of whether the first input voltage is above or below a second threshold voltage responsive to a difference between the fourth and fifth transistors.

In accordance with a further embodiment, the invention involves a method of providing a voltage detector output. The method includes the steps of receiving a first input voltage at a first comparator circuit, receiving a second input voltage at a second comparator circuit, and providing an output that is representative of whether the first input voltage is above or below a first threshold voltage and that is representative of whether the first input voltage is above or below a second threshold voltage. The first comparator circuit includes a first transistor, a second transistor that is not identical to the first transistor, and a third transistor that is substantially identical to the first transistor. Each of the first, second and third transistors is commonly coupled to a first current source and is coupled to the first differential input voltage. The second detector circuit includes a fourth transistor, a fifth transistor that is not identical to the fourth transistor, and a sixth transistor that is substantially identical to the fourth transistor. Each of the fourth, fifth and sixth transistors is commonly coupled to a second current source and is coupled to the second differential input voltage. The output is representative of whether the input voltage is above or below the first threshold voltage responsive to a difference between the first and second transistors, and is representative of whether the input voltage is above or below a second threshold voltage responsive to a difference between the fourth and fifth transistors.

BRIEF DESCRIPTION OF THE DRAWINGS

The following description may be further understood with reference to the accompanying drawings in which.

The drawings are shown for illustrative purposes only.

DETAILED DESCRIPTION

Figure 1:
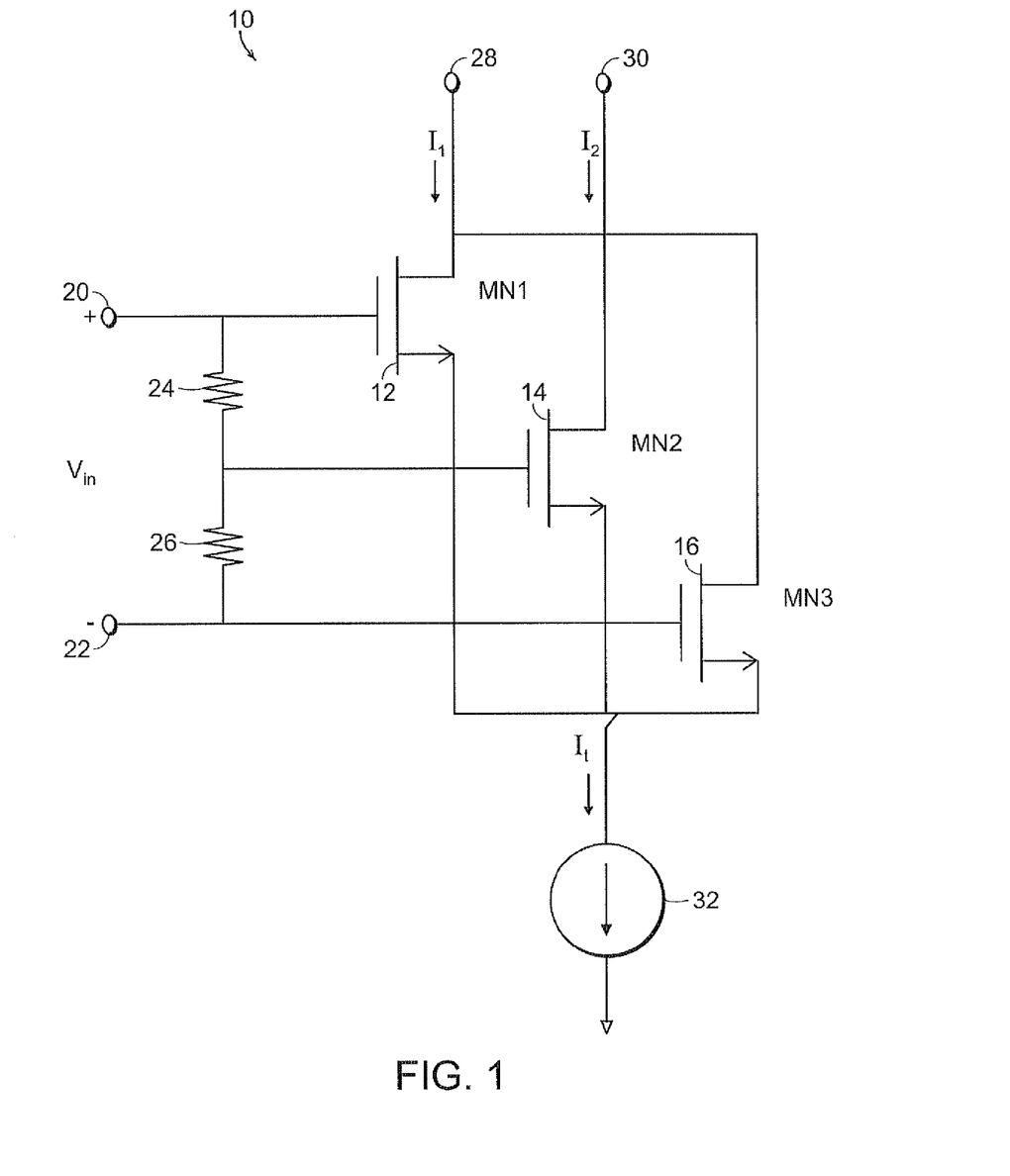
FIG. 1 shows an illustrative schematic view of a detector circuit of a system in accordance with an embodiment of the invention.

In accordance with certain embodiments, the invention provides a detection circuit that outputs a current that is proportional to the square of an input voltage. As shown in FIG. 1, a detector circuit 10 in accordance with an embodiment of the invention includes three complementary-metal-oxide-semiconductor (CMOS) transistors that are successively coupled to a voltage divider circuit that receives an input voltage to the detector circuit. The outer two of the transistors are identical to one another, and the inner transistor has a different set of operational characteristics.

The circuit 10 includes three N-channel metal-oxide-semiconductor-field-effect-transistors (MOSFETs) 12, 14 and 16. An input voltage is provided to nodes 20 and 22, and a voltage divider circuit including resistors 24 and 26 is provided between the input nodes 20 and 22. The gate of the first transistor 12 is connected to the input node 20, the drain of the first transistor 12 is coupled to a first current output node 28, and the source of the first transistor 12 is coupled to a current source 32. The gate of the second transistor 14 is connected to a midpoint in the voltage divider circuit, the drain of the second transistor 14 is coupled to a second current output node 30, and the source of the second transistor 14 is coupled to the current source 32. The gate of the third transistor 16 is connected to the input node 22, the drain of the third transistor 16 is coupled to the first current output node 28, and the source of the third transistor 16 is coupled to the current source 32.

Figure 2A:
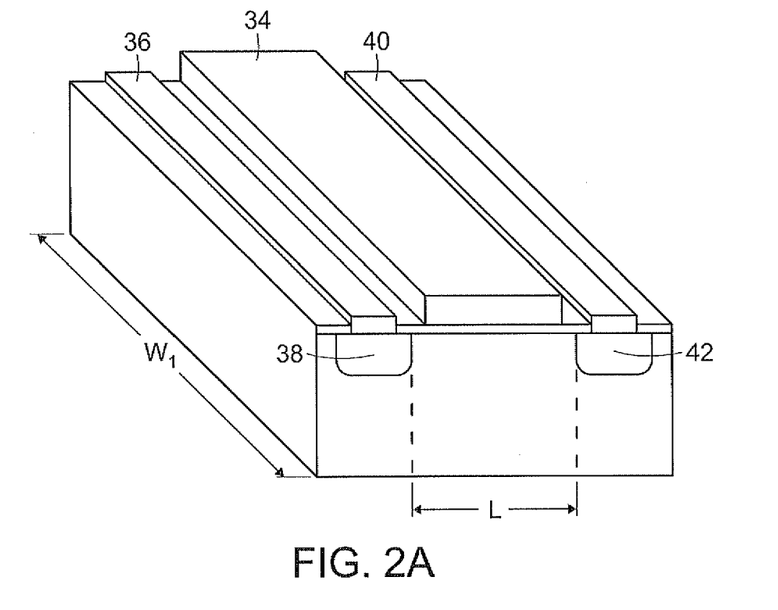
FIGS. 2A and 2B show illustrative diagrammatic views of transistors that may be used in a system in accordance with an embodiment of the invention.
Figure 2B:
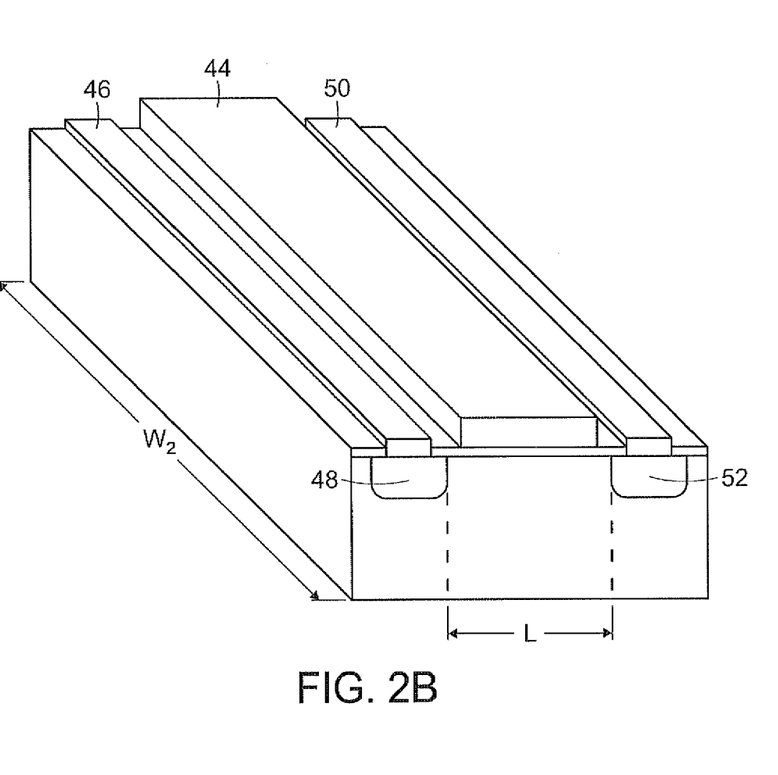

The resistors 24 and 26 are equal to one another, and the transistors 12 and 16 are identical to one another. The transistor 14 is different than each of the transistors 12 and 16. For example, the transistor 14 may have a width that is different than the width of the transistors 12 and 16. As shown in FIG. 2A, a CMOS transistor having a gate 34, a source 36 (and associated source-doped region 38) and a drain 40 (and associated drain-doped region 42) may have a width $W_1$. As shown in FIG. 2B, another CMOS transistor having a gate 44, a source 46 (and associated source-doped region 48) and a drain 50 (and associated drain-doped region 52) may have a width $W_2$. Other than the difference in width, all of the remaining characteristics of the two transistors (including length L) are the same. In other embodiments, other characteristics of the transistors other than width (e.g., length) may be varied as desired.

The circuit of FIG. 1, therefore, provides a window comparator circuit that provides two output currents ($I_1$ and $I_2$ as shown), the sum of which equals the current of the source 32 ($I_T$). The length and width of the transistors may be chosen to provide desired gate-to-source voltages for the transistors as follows. The sum of the voltages $V_{in}$–the gate-to-source voltage of the transistor 12 ($V_{GS1}$)+the gate-to-source voltage of the transistor 16 ($V_{GS3}$)=0, and the sum of the voltages $V_{in}/2$–the gate-to-source voltage of the transistor 12 ($V_{GS1}$)+the gate-to-source voltage of the transistor 14 ($V_{GS2}$)=0. The gate-to-source voltages for each of the transistors may therefore be defined as follows, where $V_T$ is the transistor threshold voltage, $\mu$ is the carrier mobility, $C_{OX}$ is the gate-oxide capacitance per unit area, $W_1$ is the width of transistor 12, $W_2$ is the width of transistor 14, and $W_3$ is the width of transistor 16.

$$V_{GS1} = \sqrt{\frac{2I_{D1}}{\mu C_{ox}} \frac{L}{W_1}} + V_T$$

$$V_{GS2} = \sqrt{\frac{2I_{D2}}{\mu C_{ox}} \frac{L}{W_2}} + V_T$$

$$V_{GS3} = \sqrt{\frac{2I_{D3}}{\mu C_{ox}} \frac{L}{W_3}} + V_T$$

The current $I_1$ is the current at the drain of the MOSFET transistor 12, $I_{D1}$, which equals the current at the source of the MOSFET transistor 12, plus the current at the drain of the MOSFET transistor 16, $I_{D3}$, which equals the current at the source of the MOSFET transistor 16. The current $I_2$ is the current at the drain of the MOSFET transistor 14, $I_{D2}$, which equals the current at the source of the MOSFET transistor 14.

Summing the currents, it is known that $I_T$–the current at the source of transistor 12 ($I_{D1}$)–the current at the source of the transistor 14 ($I_{D2}$)–the current at the source of the transistor 16 ($I_{D3}$)=0. It is also known that the width of the transistor 12 equals the width of the transistor 16 ($W_1=W_3$), and that the width of the all of the transistors together ($W_1+W_2+W_3=W_T$) equals the width of the transistor 14 ($W_2$)+two times the width of the transistor 12 ($2W_1$), and that the difference between the width of the transistor 14 ($W_2$)–two times the width of the transistor 12 ($2W_1$) equals the delta width ($W_\Delta$).

Solving for the current at the drains of each of the transistors 12, 14 and 16 ($I_{D1}$, $I_{D2}$, $I_{D3}$) provides the following definitions of $I_1$ and $I_2$:

$$I_1 = I_{D1} + I_{D3} = \frac{8LI_T W_1 + \mu C_{ox} V_{in}^2 W_1 W_2}{4LW_T}$$

$$I_2 = I_{D2} = \frac{4LI_T W_2 - \mu C_{ox} V_{in}^2 W_1 W_2}{4LW_T}$$

Solving for the input voltage ($V_{in}$) for a balanced output ($I_1=I_2$) yields:

$$V_{in}|_{I_1=I_2} = \pm\sqrt{\frac{2LI_T W_\Delta}{\mu C_{ox} W_1 W_2}}$$

Although FIG. 1 shows the current source 32 coupled to the sources of the transistors 12, 14 and 16, in accordance with further embodiments, the current source could be provided at the drains of the transistors, with the sources of the first and second transistors providing the output currents.

Figure 3:
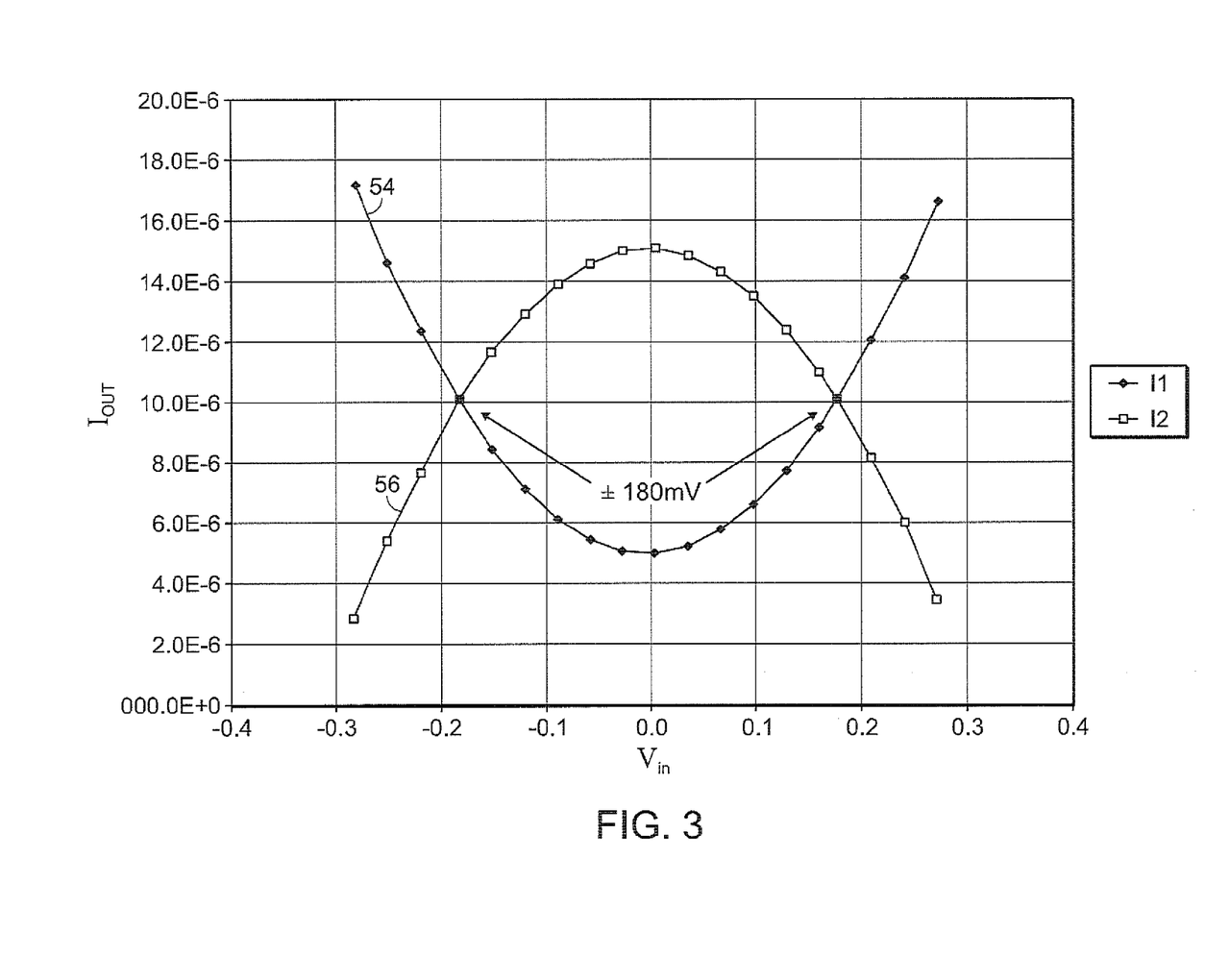
FIG. 3 shows an illustrative graphical representation of output currents in a system in accordance with an embodiment of the invention.
Figure 4:
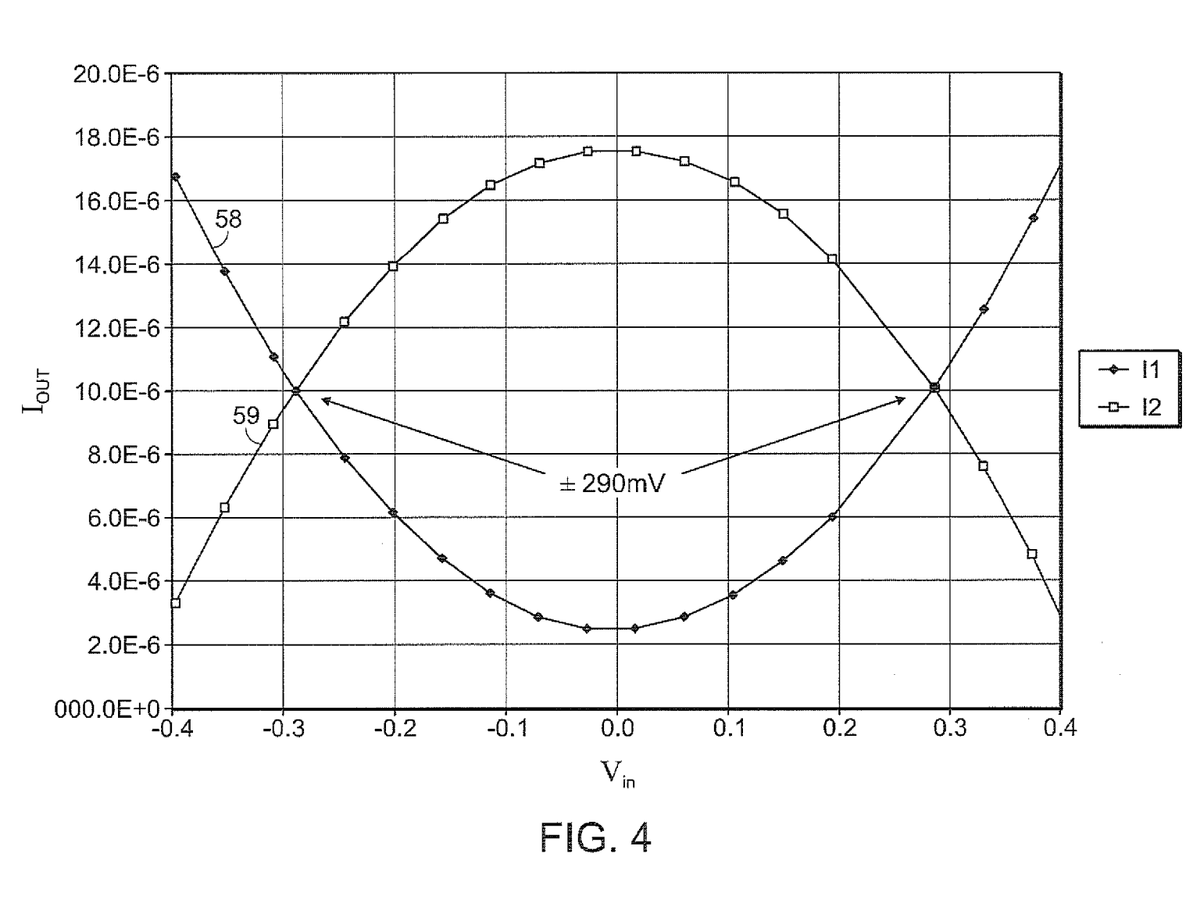
FIG. 4 shows an illustrative graphical representation of output currents in a system in accordance with another embodiment of the invention.

As shown in FIGS. 3 and 4, this relationship yields an expression that provides two cross over points of $V_{in}$ where the currents are equal to one another. FIG. 3 shows output currents ($I_1$ at 54 and $I_2$ at 56) where, for example, the width of transistor 14 is $W_2=24$ μm, each of the transistors 12 and 16 has a width of $W_1=4$ μm, transistors 12, 14, and 16 have a length of L=0.5 μm, the value $\mu C_{ox}=100$ μA/V$^2$, and $I_T=20$ μA. As shown in FIG. 3, in this example, the $V_{in}$ window is 180 mV wide.

FIG. 4 shows output currents ($I_1$ at 58 and $I_2$ at 59) where, for example, the width of transistor 14 is $W_2=28$ μm, each of the transistors 12 and 16 has a width of $W_1=2$ μm, transistors 12, 14, and 16 have a length of L=0.5 μm, the value $\mu C_{ox}=100$ μA/V$^2$, and $I_T=20$ μA. As shown in FIG. 4, in this example, the $V_{in}$ window is 290 mV wide. The currents $I_1$ and $I_2$ are plotted, therefore, in FIGS. 3 and 4 for the same value of $W_T$=32 but different values of $W_A$ ($W_A$=16 for FIG. 3 and $W_A$=24 for FIG. 4). In further embodiments, the length of the transistors may be varied, or any other physical properties of the transistors may be varied to obtain a desired window comparator circuit using three transistors.

Figure 5A:
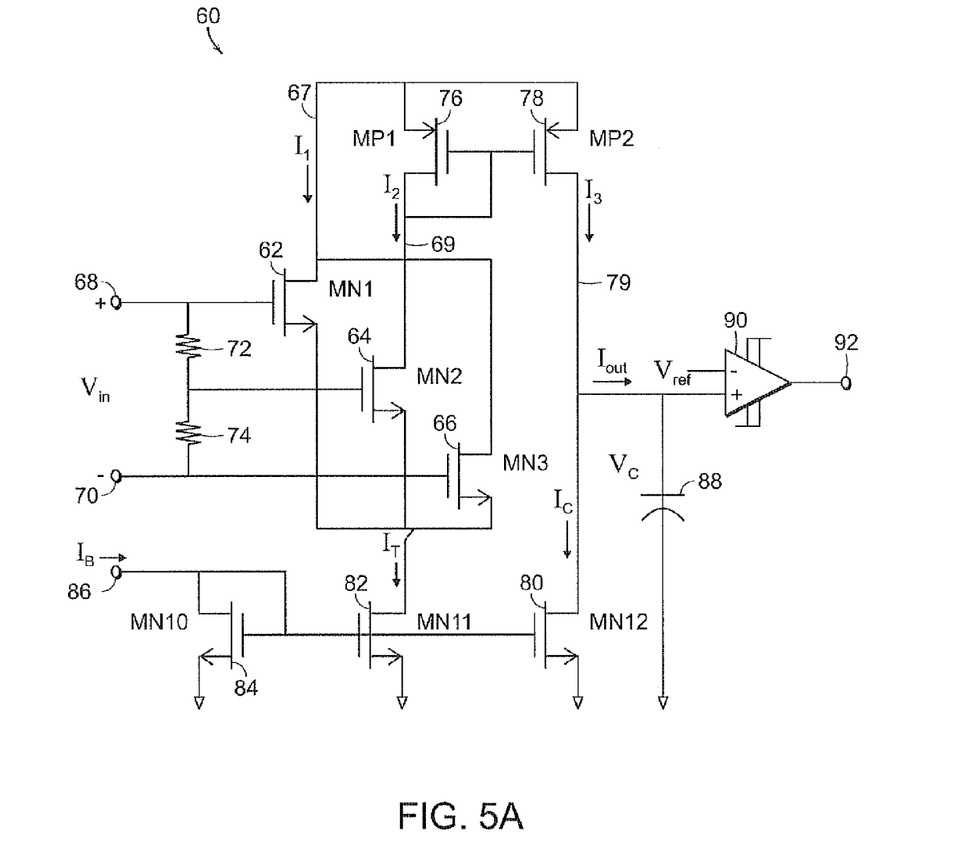
FIGS. 5A and 5B show illustrative schematic views of a detector and comparator circuits of systems in accordance with embodiments of the invention.

FIG. 5A shows a system 60 that provides detector and comparator functionality in accordance with an embodiment of the present invention. The circuit includes three N-channel metal-oxide-semiconductor-field-effect-transistors (MOSFET) 62, 64 and 66. An input voltage is provided to nodes 68 and 70, and a voltage divider circuit including resistors 72 and 74 is provided between the input nodes 68 and 70. The gate of the first transistor 62 is connected to the input node 68, the drain of the first transistor 62 is coupled to a first current path 67, and the source of the first transistor 62 is coupled to a current source transistor 82. The gate of the second transistor 64 is connected to a midpoint in the voltage divider circuit, the drain of the second transistor 64 is coupled to a second current path 69, and the source of the second transistor 64 is coupled to the current source transistor 82. The gate of the third transistor 66 is connected to the input node 70, the drain of the third transistor 66 is coupled to the first current path 67, and the source of the third transistor 66 is coupled to the current source transistor 82. Again, the resistors 72 and 74 are equal to one another, and the transistors 62 and 66 are identical to one another with length L and widths $W_1=W_3$, while the transistor 64 is different than each of the transistors 62 and 66, for example, by having a length L, but width $W_2$ that is different than the width of the transistors 62 and 66.

The system 60 also includes an output current mirror circuit including P-channel CMOS transistors 76 and 78 that provide $I_3$, a replica of output current $I_2$, in a mirror current path 79. The gate and drain of the transistor 76 are coupled together, the sources of the transistors 76 and 78 are coupled together, and the gates of the transistors 76 and 78 are coupled together. The replica current $I_3$ in mirror current path 79 has substantially the same magnitude as that of output current $I_2$ in current path 69 when the size of transistors 76 and 78 are the same, or $I_3$ could be made to be a proportionally scaled replica of current $I_2$ by changing the width $W_{78}$ and/or length $L_{78}$ of transistor 78 with respect to the width $W_{76}$ and/or length $L_{76}$ of transistor 76.

The system also includes a bias current source including transistor 82 with drain current $I_T$, and also includes a mirror N-channel CMOS transistor 80. The current into the drain of the transistor 80 is $I_C$, set to be equal to the magnitude of $I_3$ when $I_1=I_2=I_T/2$, which can be accomplished by scaling the width $W_{80}$ and/or length $L_{80}$ of transistor 80 with respect to the width $W_{82}$ and/or length $L_{82}$ of transistor 82 as given by:

$$\frac{W_{80}}{L_{80}} = \frac{1}{2} \frac{W_{82} W_{78} L_{76}}{L_{82} L_{78} W_{76}}$$

The system 60 also includes a bias adjustment circuit that permits the current at the current source transistors 80 and 82 to be adjusted. The bias adjustment circuit includes a gate-drain coupled N-channel CMOS transistor 84 that receives a bias current 86 at the drain and is coupled to ground at its source. The gates of the transistors 80, 82 and 84 are all coupled together. The bias current $I_T$ may be adjusted by changing the bias current $I_B$ at node 86 or by changing the width $W_{84}$ and/or length $L_{84}$ of transistor 84 with respect to the width and/or length of transistors 80 and 82 ($W_{80}$, $L_{80}$, $W_{82}$, and $L_{82}$ as described above).

The system also includes an integrating comparator that draws a current of $I_3-I_C$. The integrating comparator includes a capacitor 88 and a differential amplifier 90, and provides an output at 92 that represents whether the input voltage is above or below the threshold voltage.

When the currents $I_1$ and $I_2$ are equal ($I_1=I_2=I_T/2$), $I_2$ and $I_3$ respond complementarily to $V_{IN}^2$, while the value of $I_T$ and $I_C$ are constant. The difference of the replica current $I_3$ and bias current $I_C$ is the output current $I_{OUT}$, which is integrated by capacitor 88 to provide a voltage $V_C$, as given by the following relationship:

$$V_C = \frac{1}{C} \int_{-\infty}^{t} I_{OUT}(t)\, dt$$

The root-mean-squared (RMS) level of the input is either higher or lower than a threshold level ($V_{TH}$) as given by:

$$V_{TH} = \sqrt{\frac{2L I_T W_\Delta}{\mu C_{OX} W_1 W_2}}$$

where:

$$W_\Delta = W_2 - W_1 - W_3$$

resulting in negative $I_{OUT}$ and decreasing $V_C$, or positive $I_{OUT}$ and increasing $V_C$, respectively, which provides the comparator functionality. Hysteresis amplifier 90 amplifies the difference between a reference voltage $V_{REF}$ and $V_C$, where $V_{REF}$ is a sufficient voltage within the output compliance range of transistors 78 and 80, to provide an output 92 with buffering and noise margin improvement. In other embodiments, the threshold may be adjusted through variation of bias currents $I_T$ and $I_C$ through the lengths and widths of transistors 80, 82 and 84, or geometries L, $W_\Delta$, $W_1$, and $W_2$ through the lengths and widths of transistors 62, 64, and 66.

Figure 5B:
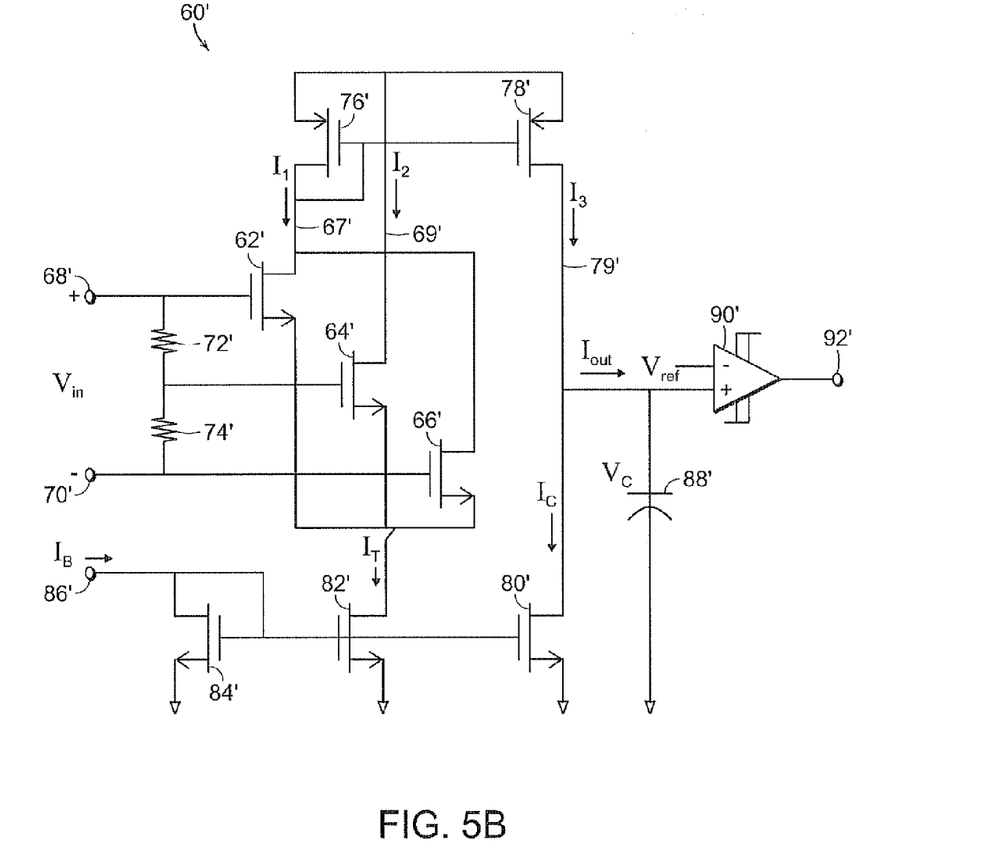

FIG. 5B shows a system 60' that provides detector and comparator functionality in accordance with an embodiment of the present invention. The circuit includes three N-channel metal-oxide-semiconductor-field-effect-transistors (MOSFET) 62', 64' and 66'. An input voltage is provided to nodes 68' and 70', and a voltage divider circuit including resistors 72' and 74' is provided between the input nodes 68' and 70'. The gate of the first transistor 62' is connected to the input node 68', the drain of the first transistor 62' is coupled to a first current path 67', and the source of the first transistor 62' is coupled to a current source transistor 82'. The gate of the second transistor 64' is connected to a midpoint in the voltage divider circuit, the drain of the second transistor 64' is coupled to a second current path 69', and the source of the second transistor 64' is coupled to the current source transistor 82'. The gate of the third transistor 66' is connected to the input node 70', the drain of the third transistor 66' is coupled to the first current path 67', and the source of the third transistor 66' is coupled to the current source transistor 82'. Again, the resistors 72' and 74' are equal to one another, and the transistors 62' and 66' are identical to one another with length L and widths $W_1=W_3$, while the transistor 64' is different than each of the transistors 62' and 66', for example, by having a length L, but width $W_2$ that is different than the width of the transistors 62' and 66'.

The system 60' also includes an output current mirror circuit including P-channel CMOS transistors 76' and 78' that provide $I_3$, a replica of output current $I_1$, in a mirror current path 79'. The gate and drain of the transistor 76' are coupled together, the sources of the transistors 76' and 78' are coupled together, and the gates of the transistors 76' and 78' are coupled together. The replica current $I_3$ in mirror current path 79' has substantially the same magnitude as that of output current $I_1$ in current path 67' when the size of transistors 76' and 78' are the same, or $I_3$ could be made to be a proportionally scaled replica of current $I_1$ by changing the width $W_{78}$ and/or length $L_{78}$ of transistor 78' with respect to the width $W_{76}$ and/or length $L_{76}$ of transistor 76'.

The system also includes a bias current source including transistor 82' with drain current $I_T$, and also includes a mirror N-channel CMOS transistor 80'. The current into the drain of the transistor 80' is $I_C$, set to be equal to the magnitude of $I_3$ when $I_1=I_2=I_T/2$, which can be accomplished by scaling the width $W_{80}$ and/or length $L_{80}$ of transistor 80' with respect to the width $W_{82}$ and/or length $L_{82}$ of transistor 82 as given by:

$$\frac{W_{80}}{L_{80}} = \frac{1}{2} \frac{W_{82} W_{78} L_{76}}{L_{82} L_{78} W_{76}}$$

The system 60' also includes a bias adjustment circuit that permits the current at the current source transistors 80' and 82' to be adjusted. The bias adjustment circuit includes a gate-drain coupled N-channel CMOS transistor 84' that receives a bias current 86' at the drain and is coupled to ground at its source. The gates of the transistors 80', 82' and 84' are all coupled together. The bias current $I_T$ may be adjusted by changing the bias current $I_B$ at node 86' or by changing the width $W_{84}$ and/or length $L_{84}$ of transistor 84' with respect to the width and/or length of transistors 80' and 82' ($W_{80}$, $L_{80}$, $W_{82}$, and $L_{82}$ as described above).

The system also includes an integrating comparator that draws a current of $I_3 - I_C$. The integrating comparator includes a capacitor 88' and a differential amplifier 90', and provides an output at 92' that represents whether the input voltage is above or below the threshold voltage.

When the currents $I_1$ and $I_2$ are equal ($I_1=I_2=I_T/2$), $I_2$ and $I_3$ respond complementarily to $V_{IN}^2$, while the value of $I_T$ and $I_C$ are constant. The difference of the replica current $I_3$ and bias current $I_C$ is the output current $I_{OUT}$ which is integrated by capacitor 88' to provide a voltage $V_C$, as given by the following relationship:

$$V_C = \frac{1}{C} \int_{-\infty}^{\tau} I_{OUT}(t)\,dt$$

The root-mean-squared (RMS) level of the input is either higher or lower than a threshold level ($V_{TH}$) as given by:

$$V_{TH} = \sqrt{\frac{2 L I_T W_\Delta}{\mu C_{OX} W_1 W_2}}$$

where:

$$W_\Delta = W_2 - W_1 - W_3$$

resulting in positive $I_{OUT}$ and increasing $V_C$, or negative $I_{OUT}$ and decreasing $V_C$, respectively, which provides the comparator functionality. Hysteresis amplifier 90' amplifies the difference between a reference voltage $V_{REF}$ and $V_C$, where $V_{REF}$ is a sufficient voltage within the output compliance range of transistors 78' and 80', to provide an output 92' with buffering and noise margin improvement. In other embodiments, the threshold may be adjusted through variation of bias currents $I_T$ and $I_C$ through the lengths and widths of transistors 80', 82' and 84', or geometries L, $W_A$, $W_1$, and $W_2$ through the lengths and widths of transistors 62', 64', and 66'.

Figure 6:
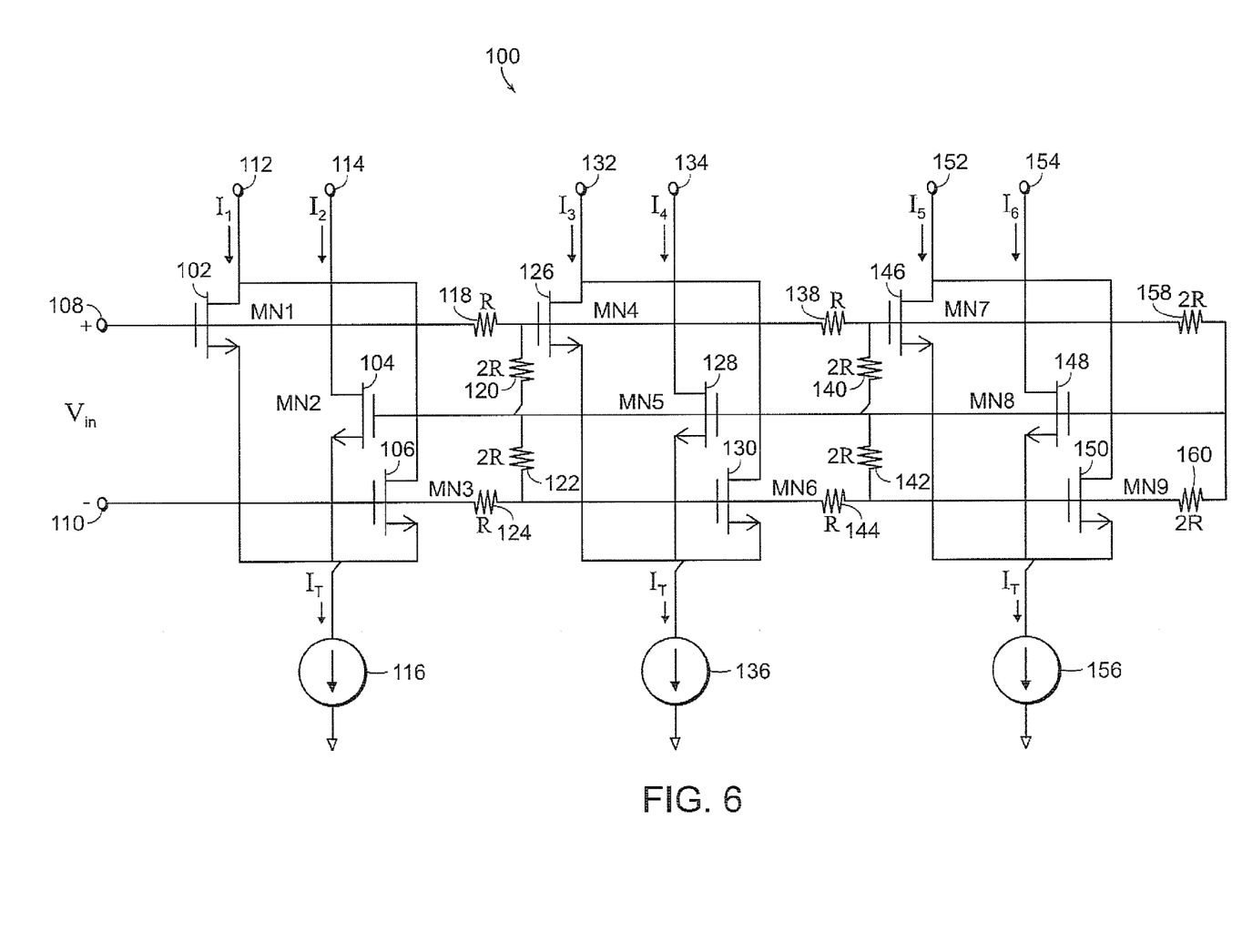
FIG. 6 shows an illustrative schematic view of a series-connected multi-level detector system in accordance with an embodiment of the invention.

In still further embodiments, the comparator circuit may be replicated and a plurality of such circuits may be coupled together in series such that each receives a different input voltage via a voltage divider network. For example, FIG. 6 shows a system 100 that includes three comparator cells for illustrative purposes. The first cell includes a set of three transistors 102, 104 and 106 that receive an input voltage between nodes 108 and 110, and provides current outputs at nodes 112, 114. The second cell includes a set of three transistors 126, 128 and 130 that receive an input voltage across voltage scaling resistors 118, 120, 122, and 124, and provides current outputs at nodes 132 and 134. The third cell includes a set of three transistors 146, 148 and 150 that receive an input voltage across voltage scaling resistors 138, 140, 142, 144, 158 and 160, and provides current outputs at nodes 152 and 154. Each of the cells is coupled to an equivalent bias current source 116, 136 and 156 respectively.

The system 100 of FIG. 6 provides that each comparator cell provides comparator output for a different input voltage range. By providing many further cells (e.g., in 6 dB increments as determined by the selection of resistors to provide adjustment through voltage scaling), a detection circuit may be provided that yields detector output at low current without using any logarithmic amplifiers. Each of the comparator cells in FIG. 6 provides a two current path output (112 and 114; 132 and 134; and 152, 154), and each of the two current path outputs may be coupled to a current mirror circuit, and a hysteresis amplifier and integrating capacitor as discussed above in connection with FIG. 5A or FIG. 5B.

Figure 7:
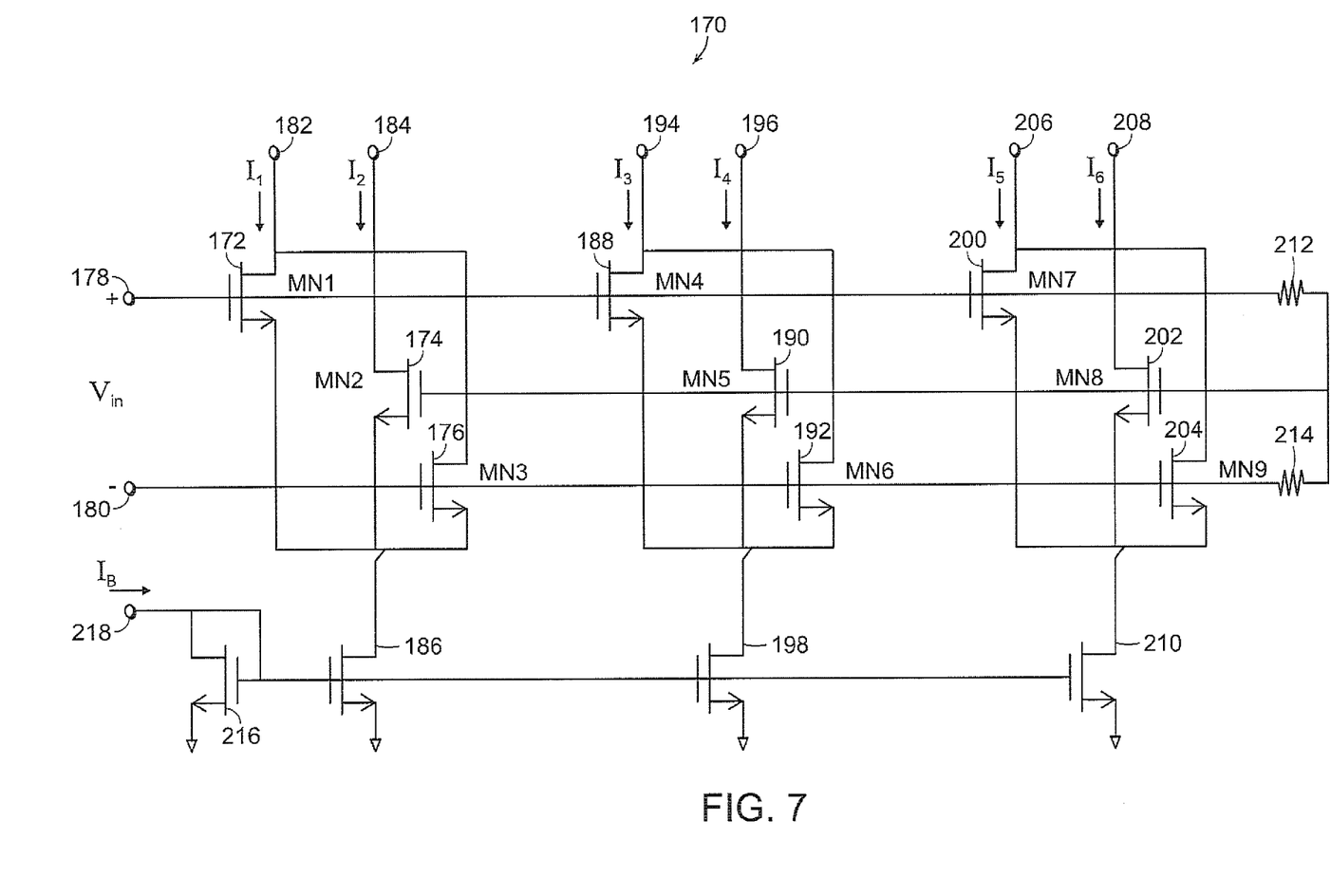
FIG. 7 shows an illustrative schematic view of a parallel-connected multi-level detector system in accordance with an embodiment of the invention.

In further embodiments, the comparator circuit may be adjusted by changing the physical characteristics of the bias current source transistor (e.g., 82 in FIG. 5A, and 82' in FIG. 5B), rather than providing voltage divider inputs (as shown in FIG. 6). This may be achieved by providing a plurality of comparator circuit cells, each having a set of transistors that provides different ratios. For example, FIG. 7 shows a system 170 that includes three comparator cells for illustrative purposes. The first cell includes a set of three transistors 172, 174 and 176 that receive an input voltage across input resistors 212 and 214 between nodes 178 and 180, and provide current outputs at 182, 184. The second cell includes a set of three transistors 188, 190 and 192 that receive the same input voltage across input resistors 212 and 214 between nodes 178 and 180, and provide current outputs at 194, 196. The third cell includes a set of three transistors 200, 202 and 204 that receive the input voltage across input resistors 212 and 214 between nodes 178 and 180, and provide current outputs at 206, 208. Each of the cells is coupled to a different bias current source. The first cell is coupled to a current source 186 that provides a current $I_T$, the second cell is coupled to a current source 198 that provides a current $I_T/2$, and the third cell is coupled to a current source 210 that provides a current $I_T/4$, where the currents are adjusted by changing the widths and/or lengths of transistors 186, 198, 210, with respect to the length and or width of transistor 216 that receives a bias current 218 at the drain and is coupled to ground at its source, as described above.

The system 170 of FIG. 7 provides that each comparator cell provides comparator output using different bias current sources. By providing many further cells (e.g., in 3 dB increments as determined by the selection of bias currents to provide adjustment through current scaling), a detection circuit may be provided that yields detector output at low current without using any logarithmic amplifiers. Each of the comparator cells in FIG. 7 also provides a two current path output (182 and 184; 194 and 196; and 206, 208), and each of the two current path outputs may be coupled to a current mirror circuit, and a hysteresis amplifier and integrating capacitor as discussed above in connection with FIG. 5A or FIG. 5B.

In accordance with a further embodiment, the current sources 186, 198 and 210 of the system 170 in FIG. 7 may all be the same as one another (e.g., all equal $I_T$), and the variation between the detector cells may be provided by having different $W_A/W_1W_2$ for each comparator cell (e.g., sizes of transistors 62, 64, and 66 in FIG. 5A, and sizes of transistors 62', 64', and 66' in FIG. 5B). In this embodiment, for example, the width of transistors 172 and 176 could each be 6 units (e.g., 10 microns each) while the width of transistor 174 is 20 units. The first cell, therefore, has a $W_A/W_1W_2$ ratio of 8/120. For the second cell, the width of transistors 188 and 192 could each be 4 units while the width of transistor 190 is 24 units. The second cell, therefore, has a $W_A/W_1W_2$ ratio of 16/96. For the third cell, the width of transistors 200 and 204 could each be 2 units while the width of transistor 202 is 28 units. The second cell, therefore, has a $W_A/W_1W_2$ ratio of 24/56. Each of the bias currents is the same, but the ratios of the transistors in each cell are therefore, varied.

By providing many further cells (e.g., in 4 dB increments as determined by the selection of transistor width and/or length to provide adjustment through geometry scaling), a detection circuit may be provided that yields detector output at low current without using any logarithmic amplifiers. Again, each of the comparator cells in FIG. 7 also provides a two current path output that may be coupled to a current mirror circuit, and a hysteresis amplifier and integrating capacitor as discussed above in connection with FIG. 5A or FIG. 5B.

The N-channel CMOS transistors employed in the embodiments shown in FIGS. 1, 5A, 5B, and 6-7 may be implemented using bulk complementary-metal-oxide-semiconductor and/or gallium-arsenide (GaAs) transistor technologies, as well as silicon-on-insulator and/or silicon-on-sapphire wafer technologies as disclosed, for example, in U.S. Pat. No. 7,123,898 the disclosure of which is hereby incorporated by reference. Detector circuits of the invention may be used, for example, power detection circuits such as transmission power detection systems in wireless communication systems.

Although the above disclosed embodiments of detector circuits shown in FIGS. 1, 5A, 5B, and 6-7 employ N-channel CMOS transistors, P-channel transistors could be used in further embodiments with appropriate inversions of polarities and references. In accordance with further embodiments of the invention, other transistor such as bipolar transistors may also be used.

Those skilled in the art will appreciate that numerous variations and modifications may be made to the above disclosed embodiments without departing from the spirit and scope of the invention.

What is claimed is:

1. A power detection system comprising:
a detector circuit that includes a first transistor, a second transistor that is not identical to the first transistor, and a third transistor that is substantially identical to the first transistor, each of said transistors being commonly coupled to a current source and being coupled at a gate thereof to a differential input voltage; and
a comparator circuit for providing an output that is representative of whether the input voltage is above or below a threshold voltage responsive to a difference between the first transistor and the second transistor.

2. The power detection system as claimed in claim 1, wherein said second transistor has a width that is different than a width of the first transistor.

3. The power detection system as claimed in claim 1, wherein said first, second and third transistors are N-channel metal-oxide-semiconductor-field-effect-transistors.

4. The power detection system as claimed in claim 1, wherein the comparator circuit includes a current mirror circuit for providing a replica current of a current through second transistor.

5. The power detection system as claimed in claim 1, wherein the comparator circuit includes an integrating amplifier for providing an output signal.

6. The power detection system as claimed in claim 1, wherein the current source is provided by a bias circuit that is controlled by a bias current.

7. The power detection system as claimed in claim 1, wherein said power detection system is coupled to further comparator circuits in series.

8. The power detection system as claimed in claim 7, wherein said further comparator circuits are coupled together via a voltage divider network.

9. The power detection system as claimed in claim 1, wherein said comparator circuit is coupled to further comparator circuits in parallel.

10. The power detection system as claimed in claim 9, wherein said further comparator circuits have current sources that provide different currents.

11. The power detection system as claimed in claim 9, wherein said further comparator circuits have sets of three transistors that have different characteristics than characteristics of the first transistor, second transistor, and third transistors.

12. A power detection system comprising:
a first detector circuit that includes a first transistor, a second transistor that is not identical to the first transistor, and a third transistor that is substantially identical to the first transistor, each of said first, second and third transistors being commonly coupled to a first current source and being coupled to a first differential input voltage;
a second detector circuit that includes a fourth transistor, a fifth transistor that is not identical to the fourth transistor, and a sixth transistor that is substantially identical to the fourth transistor, each of said fourth, fifth and sixth transistors being commonly coupled to a second current source and being coupled to a second differential input voltage; and
a comparator circuit for providing an output that is representative of whether the first input voltage is above or below a first threshold voltage responsive to a difference between the first and second transistors, and that is representative of whether the first input voltage is above or below a second threshold voltage responsive to a difference between the fourth and fifth transistors.

13. The power detection system as claimed in claim 12, wherein said second transistor has a width that is different than a width of the first transistor, and the fifth transistor has a width that is different than a width of the fourth transistor.

14. The power detection system as claimed in claim 12, wherein a first ratio of a width of the second transistor minus a width of the first transistor minus a width of the third transistor to a product of the width of the first transistor multiplied by the width of the second transistor is different than a second ratio of a width of the fifth transistor minus a width of the fourth transistor minus a width of the sixth transistor to a product of the width of the fourth transistor multiplied by the width of the fifth transistor.

15. The power detection system as claimed in claim 12, wherein said first and second current sources provide the same amount of current.

16. The power detection system as claimed in claim 12, wherein said first current source provides a first current and the second current source provides a second current that is different than the first current.

17. The power detection system as claimed in claim 12, wherein said first, second, third, fourth, fifth and sixth transistors are N-channel metal-oxide-semiconductor-field-effect-transistors.

18. The power detection system as claimed in claim 12, wherein the first differential input voltage is the same as the second differential input voltage.

19. The power detection system as claimed in claim 12, wherein the first differential input voltage is the different than the second differential input voltage.

20. A method of providing a voltage detector output, said method comprising the steps of:
  receiving a first differential input voltage at a first comparator circuit that includes a first transistor, a second transistor that is not identical to the first transistor, and a third transistor that is substantially identical to the first transistor, each of said first, second and third transistors being commonly coupled to a first current source and being coupled to a first differential input voltage;
  receiving a second differential input voltage at a second detector circuit that includes a fourth transistor, a fifth transistor that is not identical to the fourth transistor, and a sixth transistor that is substantially identical to the fourth transistor, each of said fourth, fifth and sixth transistors being commonly coupled to a second current source and being coupled to a second differential input voltage; and
  providing an output that is representative of whether the input voltage is above or below a first threshold voltage responsive to a difference between the first and second transistors, and that is representative of whether the input voltage is above or below a second threshold voltage responsive to a difference between the fourth and fifth transistors.

* * * * *